United States Patent [19]

Nakato

[11] Patent Number: 5,792,679
[45] Date of Patent: Aug. 11, 1998

[54] METHOD FOR FORMING SILICON-GERMANIUM/SI/SILICON DIOXIDE HETEROSTRUCTURE USING GERMANIUM IMPLANT

[75] Inventor: Tatsuo Nakato, Vancouver, Wash.

[73] Assignees: Sharp Microelectronics Technology, Inc., Camas, Wash.; Sharp Kabushiki Kaisha, Osaka, Japan

[21] Appl. No.: 113,995

[22] Filed: Aug. 30, 1993

[51] Int. Cl.$^6$ ................................................. H01L 21/334
[52] U.S. Cl. ...................... 438/162; 438/285; 438/412; 438/407
[58] Field of Search ................... 437/24, 26, 126; 438/162, 219, 285, 295, 423, 407, 217, 412

[56] References Cited

U.S. PATENT DOCUMENTS

| | | | |
|---|---|---|---|
| 4,816,421 | 3/1989 | Dynes et al. | 437/26 |
| 4,837,173 | 6/1989 | Alvis et al. | |
| 4,920,076 | 4/1990 | Holland et al. | |
| 5,137,838 | 8/1992 | Ramde et al. | 437/24 |
| 5,215,931 | 6/1993 | Houston | 437/21 |
| 5,215,935 | 6/1993 | Nagao | |
| 5,223,445 | 6/1993 | Fuse | |
| 5,312,766 | 5/1994 | Aronowitz et al. | |
| 5,356,827 | 10/1994 | Ohoka | 437/62 |
| 5,360,749 | 11/1994 | Antum et al. | |

OTHER PUBLICATIONS

Yu, K.M., et al. Formation of Burial Epitaxial Si–Ge Alloy . . . Ge Ion Implantation, Mater. Res. Soc. 1992 (Symposium) pp. 293–298 of XIX+913, Dec. 1991 (Abstract Only).

Hemmert, P.L.F., et al. "Nucleation and Dependence of SiO$_2$ Precipitates in in SOI/SIMOX Related Materials—Dependence Upon Damage and Atomic Oxygen Energy Profiles", Instruments and Methods in Physics Research B(39), 1989, pp. 210–214.

Selvakumar et al., "SiGe–Channel n–MOSFET by Germanium Implantation", IEEE Electron Device Letters, vol. 12, No. 8, Aug. 1991, pp. 444–446.

Verdonckt-Vandebroek et al., "Design Issues For SiGe Heterojunction FETs", IEEE, VII–2, 1991, pp. 425–434.

Rabkin et al., "Simulation of heterostructure FET's Fabricated in Type I and Type II Si/SiGe Material Systems", The Simulation Standard, Jan./Feb. 1993, pp. 8–9.

Subbanna et al., "Si/SiGe p–Channel MOSFETs", IBM Research Division, 11–1, pp. 103–104.

Murakami et al., "Strain–Controlled Si–Ge Modulation–Doped FET with Ultrahigh Hole Mobility", IEEE Electron Device Letters, vol. 12, No. 2, Feb. 1991, pp. 71–73.

Iyer et al., "A Gate–Quality Dielectric System for SiGe Metal–Oxide–Semiconductor Devices", IEEE Electron Device Letters, vol. 12, No. 5, May 1991, pp. 246–248.

Garone et al., "Hole Confinement in MOS–Gated Ge$_x$Si$_{1-x}$/Si Heterostructures", IEEE Electron Device Letters, vol. 12, No. 5, May 1991, pp. 230–232.

Srivatsa et al., "Nature of interfaces and oxidation processes in GE$^+$–implanted Si", J. Appl. Phys., vol. 65, No. 10, 15 May 1989, pp. 4028–4032.

Konig et al., "N–Channel Si–SiGe MODFET's: Effects of Rapid Thermal Activation on the DC Performance", IEEE Electron Device Letters, vol. 14, No. 3, Mar. 1993, pp. 97–99.

(List continued on next page.)

*Primary Examiner*—George R. Fourson
*Attorney, Agent, or Firm*—Fliesler, Dubb, Meyer & Lovejoy

[57] ABSTRACT

A method for fabricating a GeSi/Si/SiO$_2$ heterostructure comprises the steps of: (a) providing a monocrystalline Si substrate; (b) defining a GeSi region within the Si substrate while leaving a Si cap overlying the GeSi region, the Si cap being an integral part of the monocrystalline substrate; and (c) oxidizing part of the Si cap to thereby produce the GeSi/Si/SiO$_2$ heterostructure.

34 Claims, 6 Drawing Sheets

OTHER PUBLICATIONS

Verdonckt–Vandebroek et al., "Graded SiGe–Channel Modulation–Doped p–MOSFETs", IBM Research Division, 11–2, pp. 105–106.

Nayak et al., "Channel Mobility of GeSi Quantum–Well p–Mosfet's", Department of Electrical Engineering, University of California, Los Angeles, 11–3, pp. 107–108.

Ismail et al., "High–Transconductance n–Type Si/SiGe Modulation–Doped Field–Effect Transistors", IEEE Electron Device Letters, vol. 13, No. 5, May 1992, pp. 229–231.

METHOD FOR FORMING SILICON-GERMANIUM/SI/SILICON DIOXIDE HETEROSTRUCTURE USING GERMANIUM IMPLANT

BACKGROUND

Field of the Invention

The invention relates generally to the fabrication of semiconductor devices. The invention relates more specifically to a method for forming a high quality insulator in combination with GeSi or another mobility enhancing material having a charge carrier mobility that is greater than the charge carrier mobility of silicon.

Cross Reference to Related Applications

The following copending U.S. patent applications are assigned to the assignee of the present application, are related to the present application and their disclosures are incorporated herein by reference:

(A) Ser. No. 07/861,141 filed Mar. 31, 1992 by Tatsuo Nakato and entitled, GRADED IMPLANTATION OF OXYGEN AND/OR NITROGEN CONSTITUENTS TO DEFINE BURIED ISOLATION REGION IN SEMICONDUCTOR DEVICES;

(B) Ser. No. 08/028,832 filed Mar. 10, 1993 now U.S. Pat. No. 5,278,077, by Tatsuo Nakato and entitled, PIN-HOLE PATCH METHOD FOR IMPLANTED DIELECTRIC LAYER; and (C) Ser. No. 08/049,735 filed Apr. 20, 1993, now abandoned, by Sheng Teng Hsu and Tatsuo Nakato and entitled, Ge—Si SOI MOS TRANSISTOR AND METHOD OF FABRICATING SAME.

Cross Reference to Related Other Publications

The following publications are believed to be related to the present application and are cited here for purposes of reference:

(a) S. Verdonckt-Vandebroek et al (IBM), "Design Issues for SiGe hetero-junction FETs," IEEE 1991, pp 425–434 (Full citation not known.)

(b) E. Murakami et al. "Strain-Controlled Si—Ge Modulation-doped FET with Ultrahigh Hole Mobility," IEEE Electron Device Letters, Vol. 12, No. 2, February 1991;

(c) S. S. Iyer et al., "A Gate-Quality Dielectric System for SiGe Metal-Oxide-Semiconductor Device," IEEE Electron Device Letters, Vol. 12, No. 5, May 1991;

(d) P. M. Garone et al., "Hole Confinement in MOS-Gated $Ge_xSi_{1-x}$/Si Heterostructures," IEEE Electron Device Letters, Vol. 12, No. 5, May 1991;

(e) C. R. Selvakumar et al., "SiGe-Channel M-MOSFET By Germanium Implantation" IEEE Electron Device Letters, Vol. 12, No. 5, August 1991;

(f) A. R. Srivatas et al., "Nature of Interfaces and Oxidation Processes in Ge+ Implanted Si," J. Appl. Physics 65(10) 15 May, 1989, pp 4028–4032.

Description of the Related Art

Silicon (Si) is commonly selected as the bulk material for fabricating semiconductor devices. This is done in spite of the fact that other materials such as Germanium (Ge) generally exhibit higher electron and hole mobilities. (Electron and hole mobilities in Ge are approximately 3 to 5 times that of Si.) The performance of silicon-based integrated circuits would be significantly enhanced if a practical method could be found for replacing the slower charge mobilities of silicon with the faster ones of high mobility materials such as Ge.

Unfortunately this is not easily done. One cannot simply substitute Ge for Si because Ge has its own set of problems. Ge suffers from relatively poor thermal conductivity and relatively high leakage currents. Another problem of Ge is that its oxide, $GeO_2$, has a very low breakdown voltage and thus, can not serve as a practical insulator.

Attempts to mix a better insulator such as $SiO_2$ with an adjacent layer of a Ge-containing material (e.g., an SiGe hetero-layer) suffer from the problem that high-density interface-states tend to form at interfaces between silicon oxides (e.g., $SiO_2$) and materials such as Ge and $Ge_xSi_{1-x}$. The high-density interface-states disadvantageously reduce electron/hole mobilities.

In order to reduce the interface-state problem, a tri-layer heterostructure of the form: $Ge_xSi_{1-x}$/Si/$SiO_2$ has been proposed. (See for example, the above cited work of S. Verdonckt-Vandebroek et al (IBM), "Design Issues for SiGe hetero-junction FETs," IEEE 1991.)

The $Ge_xSi_{1-x}$ portion of the tri-layer heterostructure is advantageously used for its higher electron and hole mobilities. The Si portion is used for its ability to provide reduced interface-states at the interface with the $SiO_2$ dielectric material.

The problem with previous tri-layer proposals, however, is that they employ relatively complex and costly fabrication methods for the creation of the $Ge_xSi_{1-x}$/Si/$SiO_2$ heterostructure; such as high-vacuum CVD or epitaxial growth of the $Ge_xSi_{1-x}$/Si layers. (See the Introduction in the above cited paper by C. R. Selvakumar et al., "SiGe-Channel M-MOSFET By Germanium Implantation" IEEE 1991.)

SUMMARY OF THE INVENTION

The invention overcomes the above-mentioned problems by providing a fabrication method in which a mobility enhancing species such as Ge is implanted into a portion of a low-mobility, monocrystalline material such as monocrystalline Si to define a mobility-enhanced heterostructure such as a $Ge_xSi_{1-x}$/Si heterostructure. The Ge implant is preferably graded in concentration, with high concentration (e.g., 25%) near the Si portion of the $Ge_xSi_{1-x}$/Si heterostructure and lesser concentration (e.g., 15%) as one moves away from the Si portion.

The juncture of the mobility-enhanced portion (e.g., the $Ge_xSi_{1-x}$ portion) of the heterostructure and adjacent Si (e.g., an overlying Si cap) defines an interface which is free of the interface-state problem found at $Ge_xSi_{1-x}$/$SiO_2$ junctures. A silicon portion of the $Ge_xSi_{1-x}$/Si heterostructure that is spaced away from the $Ge_xSi_{1-x}$/Si juncture is oxidized to form a high quality dielectric that is spaced apart from the mobility-enhanced portion (e.g., the $Ge_xSi_{1-x}$ portion) by a region of monocrystalline silicon, thus forming a $Ge_xSi_{1-x}$/Si/$SiO_2$ heterostructure. Because the Si portion of the $Ge_xSi_{1-x}$/Si/$SiO_2$ heterostructure is part of the original, monocrystalline monostructure into which the Ge was implanted; the Si portion remains generally free of undesirable stacking faults. Avoidance of stacking faults leads to improved device performance.

A method for fabricating a GeSi/Si/$Sio_2$ heterostructure in accordance with the invention comprises the steps of: (a) providing a monocrystalline Si substrate; (b) defining a $Ge_xSi_{1-x}$ region within the Si substrate by implanting a desired concentration of Ge into the substrate while leaving a Si cap overlying the $Ge_xSi_{1-x}$ region; and (c) oxidizing an upper part of the Si cap to thereby produce the GeSi/Si/SiO2 heterostructure wherein the Si portion of the $Ge_xSi_{1-x}$/Si/SiO$_2$ heterostructure is part of the original, monocrystalline Si substrate into which the Ge was implanted.

A structure in accordance with the invention comprises: (a) a monocrystalline silicon substrate having a top surface; (b) an implanted insulation/dielectric layer positioned at a first depth below the substrate top surface; (c) one or more buried $Ge_xSi_{1-x}$ regions formed by implantation and positioned at a second depth below the substrate top surface, where said second depth is less than said first depth; and (d) one or more Si regions positioned above the buried $Ge_xSi_{1-x}$ regions, where the Si regions are an integral part of the monocrystalline silicon substrate.

A method in accordance with the invention comprises the steps of: (a) implanting a mobility enhancing species such as Ge into a first region of a low-mobility first semiconductive material such as monocrystalline Si to thereby convert the first region into a second region composed of a second semiconductive material (SiGe) having a second charge carrier mobility that is substantially higher than the first charge carrier mobility of the first semiconductive material (Si); and (b) oxidizing a portion of the low-mobility first semiconductive material (Si) that is spaced apart from the second region to thereby create a heterostructure having three layers formed in the recited order of: (1) the second region into which the mobility enhancing species (Ge) are implanted; (2) a third region which remains substantially composed of the low-mobility first semiconductive material (Si); and (3) the oxidized portion of the low-mobility semiconductive material.

BRIEF DESCRIPTION OF THE DRAWINGS

The below detailed description makes reference to the accompanying drawings, in which.

DETAILED DESCRIPTION

Figure 1:
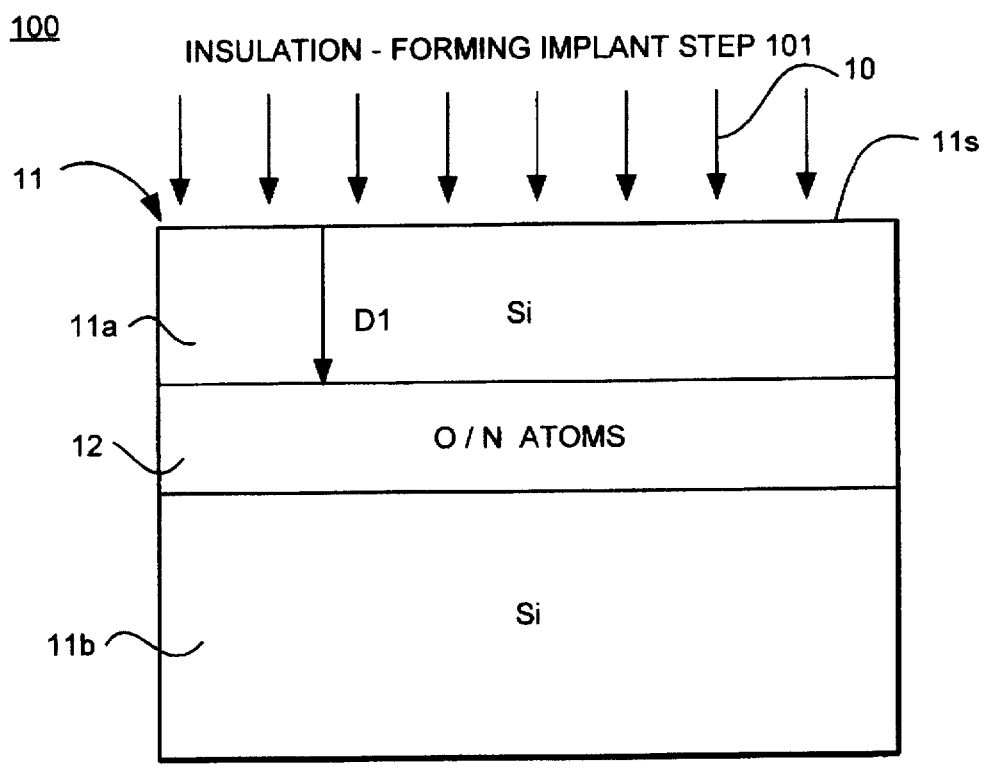
FIG. 1 is a cross sectional side view showing a first step in which oxygen or nitrogen ions are implanted into an Si substrate in order to form a SIMOX structure.

Referring to FIG. 1, in a first fabrication step 101 of the invention, oxygen and/or nitrogen ions 10 are implanted into a monocrystalline silicon substrate (wafer) 11 with a doping concentration of approximately $2 \times 10^{17}$ to $20 \times 10^{17}$ atoms/cm$^2$ using one or more implant energies selected from the range of approximately 20 KeV to 220 KeV. This creates the illustrated structure 100 in which an oxygenated and/or nitrogenated layer 12 of a desired thickness is positioned at a first range of depths $D_1$ of approximately 200 Å (Angstroms) to 4000 Å below the top surface 11s of the silicon substrate 11. (For purposes of illustrative clarity, $D_1$ is symbolized by a downwardly pointing arrow terminating at the top of layer 12. It is to be understood, however, that $D_1$ is a multi-dimensional value, referring not only to the depth of the top surface of layer 12 relative to substrate surface 11s, but also to the depth of the bottom surface of layer 12 and all depths in between. Hence $D_1$ is referred to here as a "depths range." The term "depths range" applies similarly to later described depths ranges $D_2$–$D_4$.)

Figure 2:
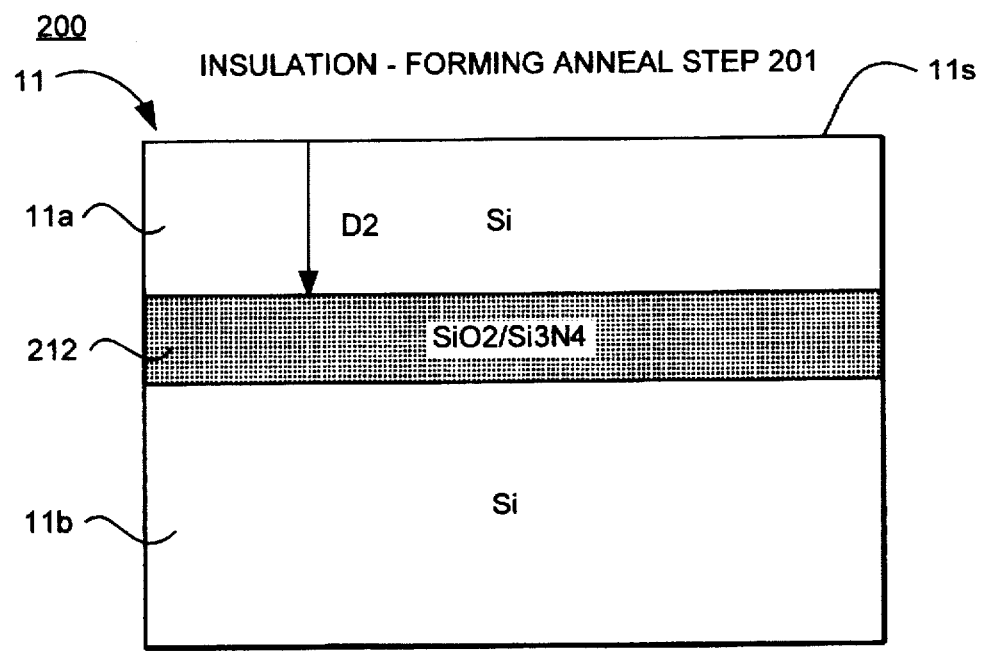
FIG. 2 is a cross sectional side view showing a second step in which the substrate is annealed, and the oxygen and/or nitrogen implant reacts with the Si of the substrate to define the buried insulator portion of the SIMOX structure.

Referring to FIG. 2, in a second fabrication step 201 of the invention, the substrate 11 is annealed at a temperature of 1300° C. or higher in order to remove at least some if not substantially all of the implantation damage caused to the crystal structure of the substrate 11 as a result of the oxygen/nitrogen implant step 101. The anneal step 201 is also used to chemically combine the implanted oxygen and/or nitrogen atoms with the neighboring silicon thereby forming a buried SiO$_2$ layer or a Si$_3$N$_4$ layer or an insulative/dielectric layer 12 of the general form: $Si_xO_yN_z$ where the sum of proportionality variables x, y and z is x+y+z=1 and 0>x<1.

Process parameters for the anneal step 201 are selected in accordance with known guidelines. An example is 1300° C. to 1400°C. for a duration of 5 minutes to 6 hours in an inert atmosphere of N$_2$ or He or Ar. Sometimes, a small dosage of less than a few percents of oxygen is mixed into the essentially inert atmosphere to form a thin oxide overcoat and thereby prevent evaporation of Si out of the substrate during the anneal.

The purpose of the first and second steps, 101 and 201 is to form the illustrated structure 200 of FIG. 2. Structure 200 provides the foundation for so-called SIMOX devices (Separation by IMplanted OXygen). The implanted and annealed layer of insulating material 212 is now positioned at a second depths range $D_2$ below the substrate top surface 11s and interposed between what will become an active device layer 11a and a bulk portion 11b of the substrate 11. (Second depths range $D_2$ is essentially the same as first depths range $D_1$. The implanted oxygen and/or nitrogen atoms 12 tend to coagulate together rather than diffuse apart as structure 100 is heated during anneal step 201, and as such, dimension $D_2$ might be minutely different from $D_1$.) The implanted insulation/dielectric layer 212 will provide DC isolation between the substrate bulk portion and active devices in the active device portion of the substrate. The insulator/dielectric layer 212 will also minimize capacitance between the active devices and the bulk portion of the substrate so that high frequency operations can be supported.

Figure 3:
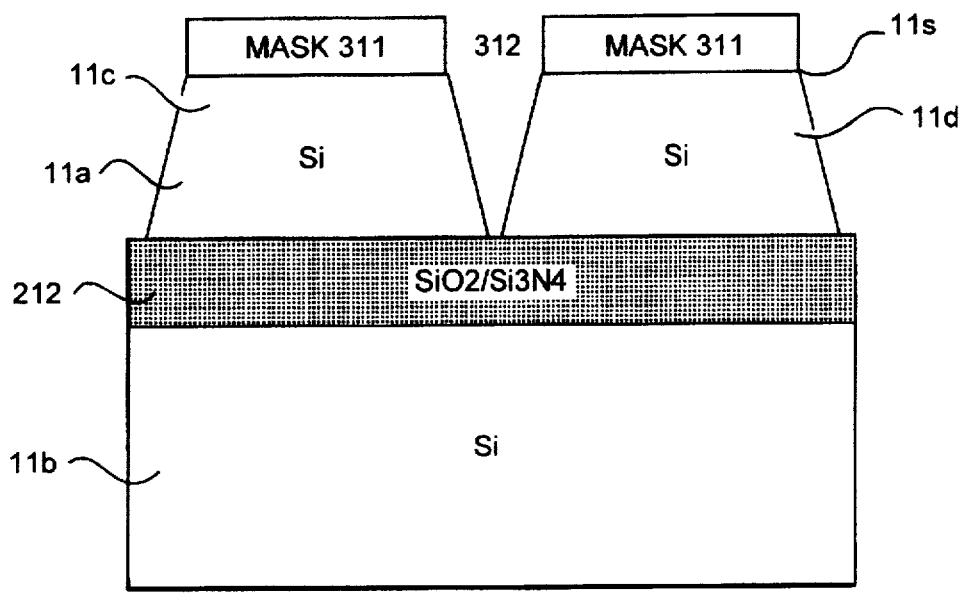
FIG. 3 is a cross sectional side view showing further steps in which a first photoresist mask is developed over the substrate; and isolation grooves are formed.

FIG. 3 shows the cross section of a subsequent third structure 300. A patterned, first photoresist mask 311 having isolation windows 312 is formed on the substrate top surface 11s in a next step 301 and exposed portions of the substrate 11 are removed essentially down to the implanted insulation/dielectric layer 212 by means of an appropriate chemical etchant or by using a fluorine plasma. The removal of silicon essentially down to layer 212 creates essentially isolated mesas 11c and 11d as shown atop the implanted insulation/dielectric layer 212.

Figure 4:
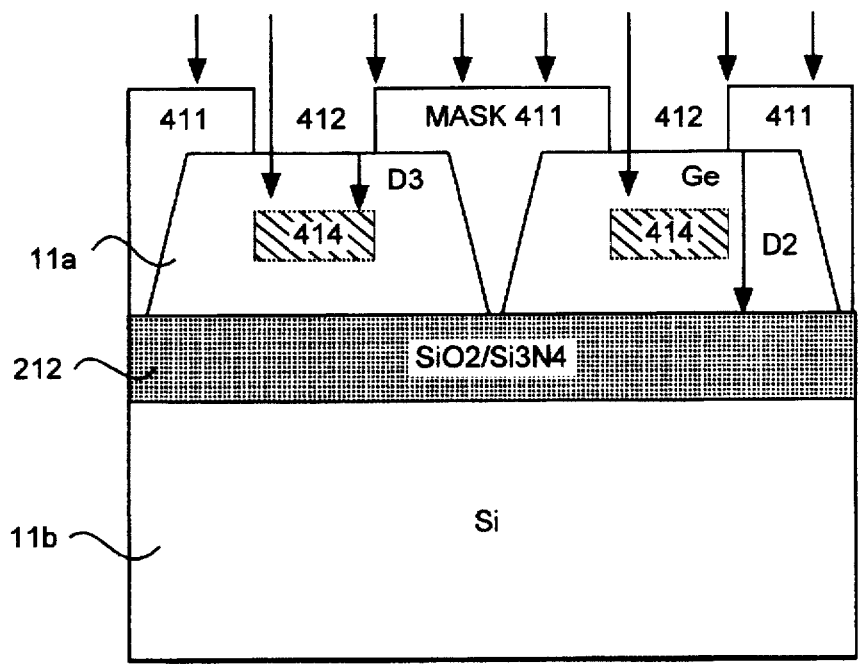
FIG. 4 is a cross sectional side view showing further steps in which a second photoresist mask is developed over the substrate, and Ge ions are selectively implanted into the substrate.

FIG. 4 shows the cross section of a subsequent fourth structure 400. First mask 311 is removed and a patterned, second photoresist mask 411 having implant windows 412 is formed on the top surfaces of mesas 11c and lid in a next step 401. Ge ions are implanted through the windows 412 of mask 411 in a following implant step 402. The implant step 402 places Ge atoms at a desired third depths range $D_3$ below the implant windows 412, where the third depths range $D_3$ includes a region above the second depths range $D_2$. (It is to be understood that maskless methods for implanting Ge into one or more desired regions of the substrate are also contemplated.) The same high energy implant equipment that is used for implanting the oxygen and/or nitrogen atoms of the SIMOX forming step 101 may be used for implanting the Ge atoms at step 402.

The result is that one or more Ge-filled regions 414 are defined at the third depths range $D_3$ below the substrate top surface 11s. A preferred range for third depths range $D_3$ is approximately 20 Å to 60 Å below the top surfaces (11s) of the mesas 11c and 11d. An example of process parameters for the Ge implant step 402 is a Ge doping concentration of approximately $1 \times 10^{16}$ to $10 \times 10^{16}$ atoms/cm$^2$ using an implant energy of approximately 40 KeV to 200 KeV.

Figure 5:
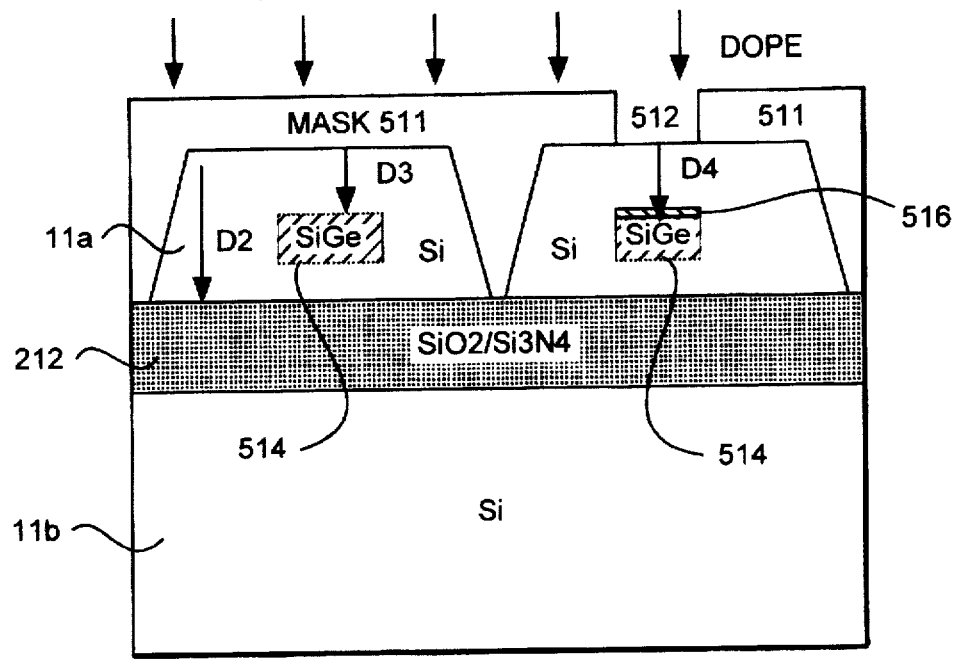
FIG. 5 is a cross sectional side view showing yet further steps in which: (5a) the substrate is annealed, (5b) the implanted Ge chemically combines with Si of the substrate to define a $Ge_xSi_{1-x}$ portion of the SIMOX structure while leaving an overlying Si cap, (5c) a third photoresist mask is developed over the substrate to delineate active transistor regions, and (5d) selective channel-doping implants are made.

FIG. 5 shows the cross section of a subsequent fifth structure 500. The substrate 11 is annealed in a next step 501 in order to remove at least some if not substantially all of the implantation damage due to the Ge or prior implants and to chemically combine the implanted Ge atoms into the neighboring silicon thereby forming one or more buried $Ge_xSi_{1-x}$ regions 514 as shown. An example of process parameters for the Ge anneal step 501 is 1100° C. in $N_2$ ambient for 30 minutes.

Figure 10:
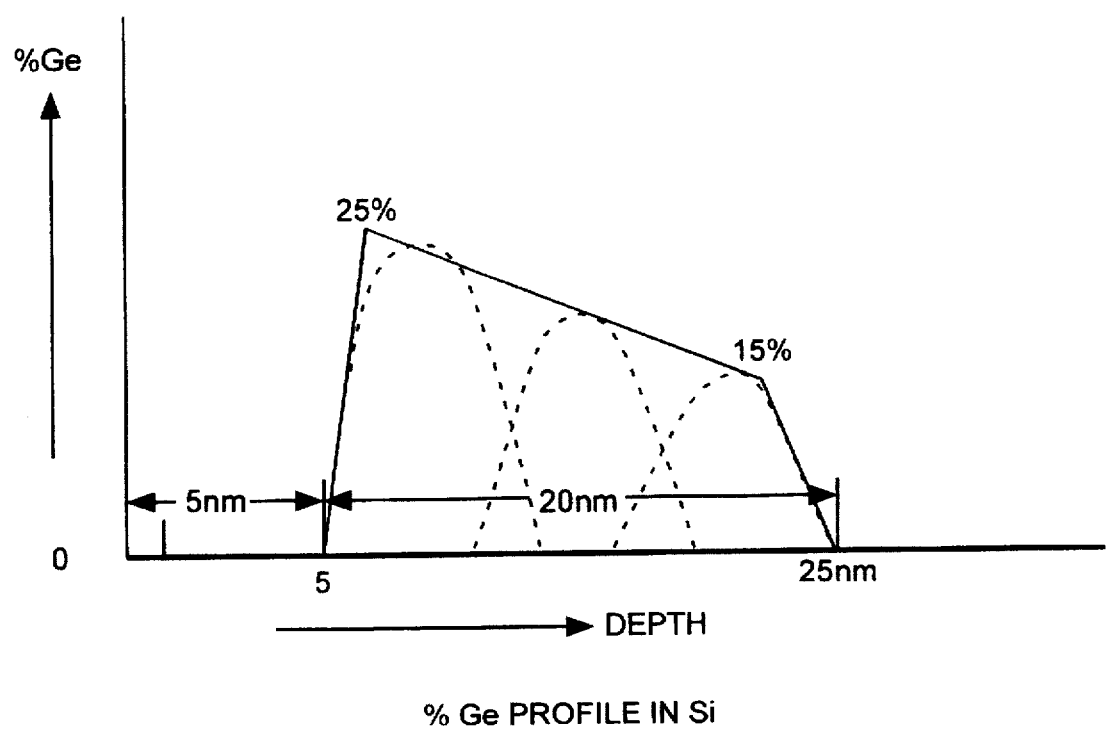
FIG. 10 is a graph showing preferred concentration profile for Ge in the composition of the $Ge_xSi_{1-x}$ part of the $Ge_xSi_{1-x}$/Si/SiO$_2$ heterostructure.

FIG. 10 shows a preferred composition profile for the $Ge_xSi_{1-x}$ portions 514 in terms of depth and atomic percentage of Ge. In this particular embodiment, the upper bound of the $Ge_xSi_{1-x}$ region is at 5 nm (50 Å) below the substrate top surface 11s while the lower bound is 25 nm (250 Å) below the substrate top surface 11s. Ge concentration peaks at 25% atomic near the upper bound of the profile as shown and decreases to 15% atomic near the lower bound of the profile as shown. Three implants of varying energy and dosage are used, as indicated by the Gaussian-shaped, dashed curves to provide the 25%-to-15% sloped profile. Annealing steps in between and/or after the plural Ge implants, smooth and merge the dashed concentrations to provide the final concentration indicated by the solid curve of FIG. 10.

A patterned, third photoresist mask 511 having dopant implant windows 512 is next formed on the top surfaces of mesas 11c and 11d in a next step 502.

In a subsequent step 503, boron (P-type) or phosphorous (N-type) ions and/or other N-type or P-type dopants are implanted through windows 512 of the third mask 511 to a desired fourth depths range $D_4$ below the exposed mesa top surfaces to form doped channel regions which are generally denoted as 516.

Fourth depths range $D_4$ can be set to terminate above, inside or below the underlying one or more buried $Ge_xSi_{1-x}$ regions 514. In other words, fourth depths range $D_4$ can overlap or not overlap third depths range $D_3$ as desired in order to create different effects. A preferred range for fourth depths range $D_4$ is approximately 10 Å to 100 Å below the top surfaces (11s) of the mesas 11c and 11d. When the fourth depths range $D_4$ is set to overlap the third depths range $D_3$ a conductive channel can be induced by means of inversion through both the doped Si region 516 and the like-doped $Ge_xSi_{1-x}$ region 514. Such inversion is induced in a subsequently formed field effect transistor (FET) that will be described below in connection with FIG. 9. Doping step 503 is referred to as the channel-doping or threshold setting step.

Figure 6:
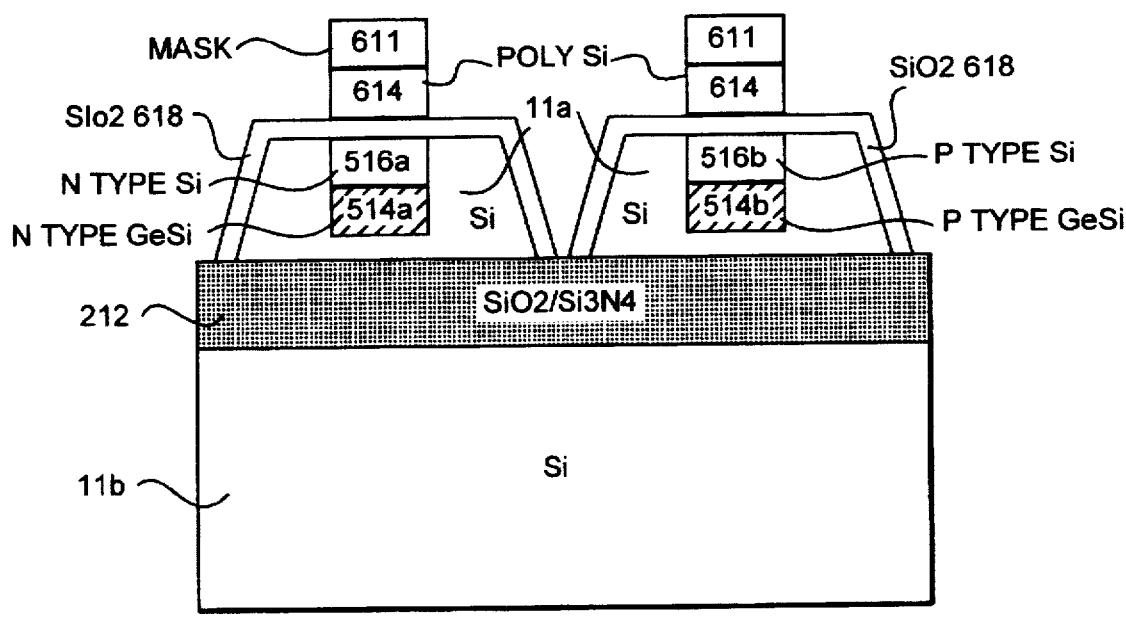
FIG. 6 is a cross sectional side view showing additional steps in which exposed Si caps are oxidized to form a gate dielectric layer, and a conductive material (e.g., polysilicon) is thereafter deposited over the grown oxide and patterned to form gate electrodes and interconnect lines.

FIG. 6 shows the cross section of a subsequent sixth structure 600. The substrate 11 is annealed in a next step 601 in order to remove at least some if not substantially all of the implantation damage due to the dopant or previous implants, and to activate the implanted N or P doping atoms thereby forming one or more doped Si regions 516a, 516b as shown. The temperature of step 601 should not exceed 1200° C.

Mask and doping steps 502, 503 can be performed as many times as needed to create a variety of doping patterns of P-type and/or N-type as desired. For purposes of example, left region 516a of FIG. 6 is shown to have been doped to have an N-type conductivity and right region 516b is shown to have been (separately) doped to have a P-type conductivity. The buried $Ge_xSi_{1-x}$ regions may optionally and simultaneously attain the illustrated N-type conductivity as shown at 514a and the illustrated P-type conductivity as shown at 514b. A preferred range of P-type or N-type doping concentration is approximately $5 \times 10^{16}$ to $5 \times 10^{17}$ doping atoms/cm$^3$.

It is to be understood that buried $Ge_xSi_{1-x}$ regions 514a–514b can be doped independently of Si regions 516a and 516b and each can have its own concentration versus depth profile.

At the same time that anneal step 601 takes place or subsequently, the top surfaces of isolated mesas 11c and 11d are oxidized by way of an oxidizing step 602. Oxidizing step 602 is preferably conducted at 950° C. to 1050° C. in an oxidizing atmosphere to from approximately 40 Å to 150 Å of thermally grown gate oxide which is shown as layer 618. The preferred range of oxide thickness for oxide layer 618 of 4 nm (nanometers) to 15 nm applies to fabrication of devices with submicron channel lengths in the range 0.1 μm to 0.8 μm. Other gate oxide thicknesses can, of course, be used as necessary or desired.

After formation of gate oxide layer 618, polysilicon is deposited uniformly over the oxide layer 618 by CVD (Chemical Vapor Deposition) or other suitable means and thereafter patterned (by photoresist and plasma etch) to form desired gate electrodes such as shown at 614 and to form desired interconnect lines (not shown).

Figure 7:
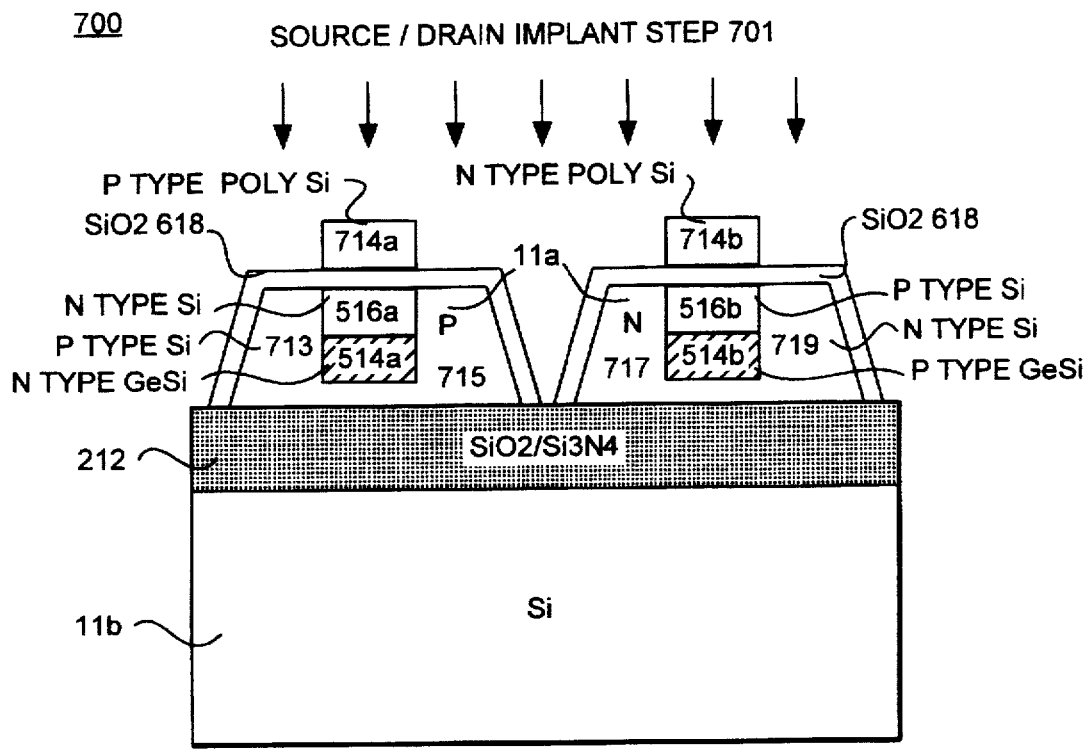
FIG. 7 is a cross sectional side view showing a following step in which dopants are selectively implanted into portions of the conductive layer and substrate.

Referring to FIG. 7, the CVD mask 611 or the photoresist (not shown) used to delineate the polysilicon electrodes 614 is removed. Phosphorous ions or boron ions are selectively implanted in a source/drain implant step 701 to from self-aligned source/drain regions 713/715 and 717/719 at opposed sides of the polysilicon electrodes 614. The source/drain implant step 701 can also be used to impart a desired P-type conductivity or N-type conductivity to the polysilicon electrodes 614. A doping concentration of approximately $5\times10^{15}$ doping atoms/cm$^2$ with an implant energy of approximately 10 KeV to 30 KeV is used in one version of the source/drain implant step 701.

In the illustrated example of FIG. 7, source region 713, gate electrode 714a, and drain region 715 are each doped to have a P-type conductivity. Drain region 717, gate electrode 714b, and source region 719 are each doped to have an N-type conductivity.

Figure 8:
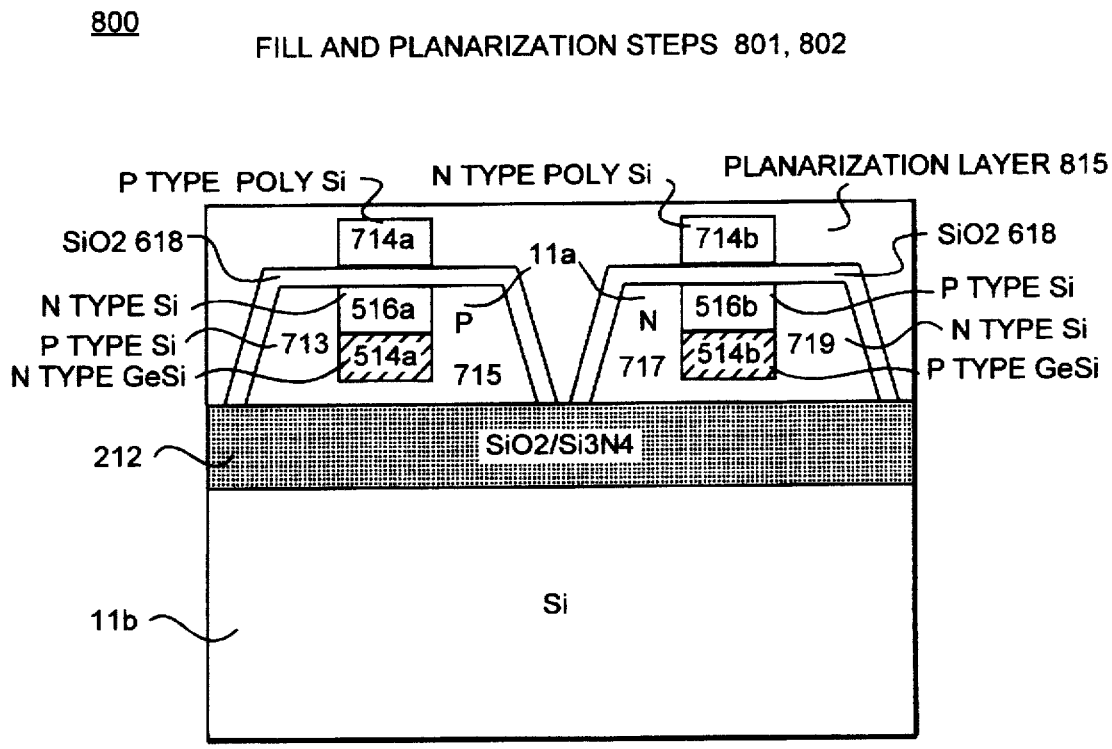
FIG. 8 is a cross sectional side view showing a further step in which an additional planarization layer is deposited on the SIMOX structure.

Referring to FIG. 8, a layer 814 of undoped or doped SiO$_2$ having a thickness of, for example, 300 nm to 1000 nm is isotropically deposited by CVD on top of the structure of FIG. 7 to provide planarization and passivation. Device fabrication is then completed with conventionally-known wafer finish steps including single or multilevel metallization and further passivation.

Figure 9:
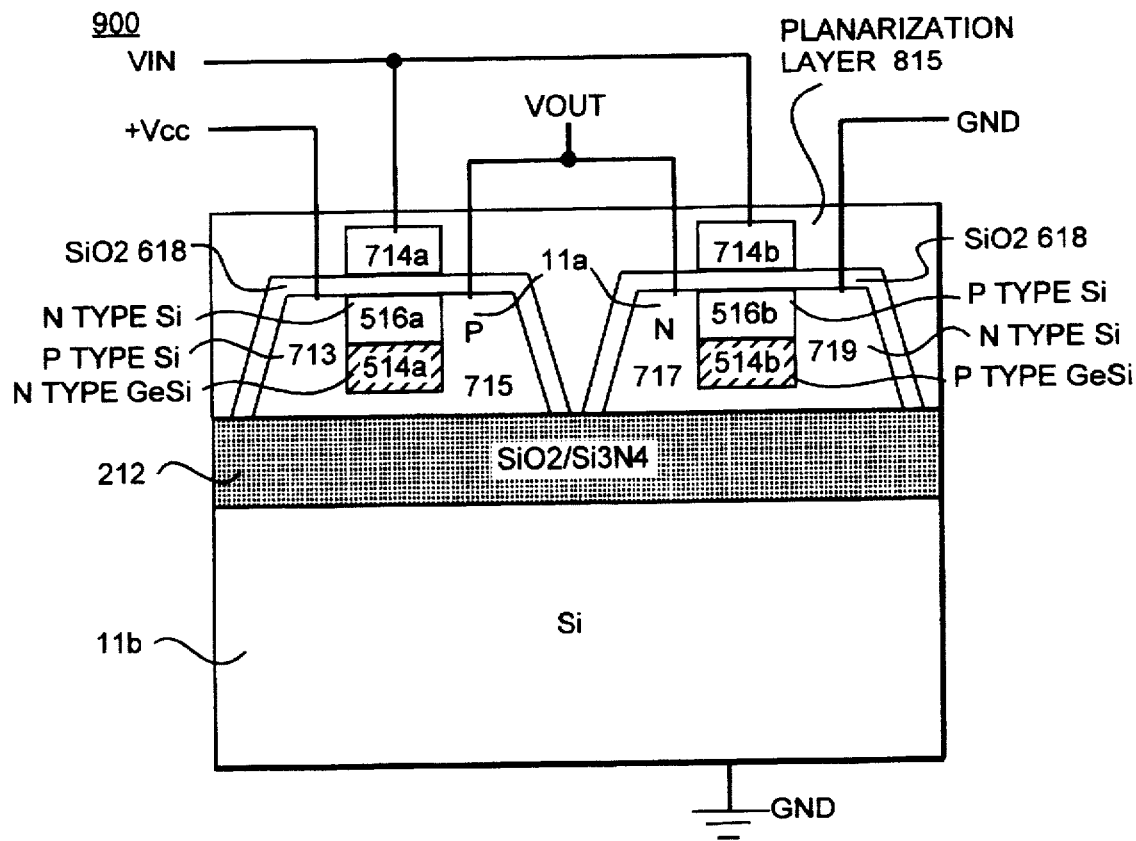
FIG. 9 is a cross sectional side view used for explaining how high mobility electrons and holes of the channel region provide improved performance.

Referring to FIG. 9, the advantages and operation of the implanted, buried Ge$_x$Si$_{1-x}$ regions 514a–514b is explained as follows. Conductive channels (not shown) are created by way of inversion in Si regions 516a and 516b when appropriate gate-to-source voltages (V$_{GS}$) are applied between respective gate electrodes 714a, 714b and source regions 713,719. As the depth of the inversion layer increases in a given transistor due to a corresponding change in gate voltage, the buried Ge$_x$Si$_{1-x}$ regions 514a–514b become conductive and contribute high mobility charge carriers (electrons and/or holes) to the conduction mechanisms of the transistor.

In the example of FIG. 9, the FET at the left is a P-channel device and the FET at the right is an N-channel device. The source 719 of the N-channel transistor is shown connected to ground, as is the bulk portion 11b of the substrate. The source 713 of the P-channel transistor is shown connected to a+V$_{cc}$ voltage line. The drains (715 and 717) of the P and N-channel transistors are tied together to output line V$_{out}$. The gates (714a and 714b) of the P and N-channel transistors are tied together to input line V$_{in}$. This interconnection configuration defines a CMOS amplifier or inverter.

The amplifier/inverter of FIG. 9 can be fabricated at low cost to operate with acceptable gain at relatively high frequencies/switching-rates because of the following features. Capacitive coupling and leakage current between the bulk portion 11b of the substrate and/or each transistor is minimized by the presence of the implant-formed insulation/dielectric layer 212. High mobility charge carriers are provided by the implanted Ge$_x$Si$_{1-x}$ regions 514a–514b. Gate dielectric layer 618 is of good quality because it is formed of thermally grown SiO$_2$ and undesirable interface-states are minimized at the Si/SiO$_2$ interface of Si regions 516a and 516b with SiO$_2$ layer 618. Mass production yields are increased due to the ability to implant the Ge$_x$Si$_{1-x}$ regions 514a–514b with relatively good precision of location and concentration at a desired depths range below the gate electrodes 714a and 714b. This in turn reduces the per device cost of fabrication.

The above disclosure is to be taken as illustrative of the invention, not as limiting its scope or spirit. The above disclosure shows how a Ge$_x$Si$_{1-x}$/Si/SiO$_2$ heterostructure can be formed in combination with SIMOX isolation. The above disclosure also shows how an Si portion, free of stacking-faults, develops in the middle of the Ge$_x$Si$_{1-x}$/Si/SiO$_2$ heterostructure. The above disclosure further shows how an integrated circuit having a plurality of high-speed mesa transistors is formed.

Numerous modifications and variations will become apparent to those skilled in the art after studying the above disclosure. By way of example, isolation formation step 301 can be carried out after the Ge implant step 402 if desired. A Ge$_x$Si$_{1-x}$ layer can be formed uniformly across the entire wafer rather than just at mask selected sites as shown in FIG. 4. The anneal, mask and dopant implant steps 501–503 of FIG. 5 can be carried out prior to the mask and Ge implant steps of FIG. 4.

Given the above disclosure of general concepts and specific embodiments, the scope of protection sought is to be defined by the claims appended hereto.

What is claimed is:

1. A method for fabricating a combination of a conductive region having a relatively high charge carrier mobility and an insulator in a substrate composed of a first semiconductive material having a comparatively lower first charge carrier mobility, said method comprising the steps of:

(a) implanting a mobility enhancing species into a first region of the low-mobility first semiconductive material to thereby convert the first region into a second region composed of a second semiconductive material having a second charge carrier mobility that is substantially higher than the first charge carrier mobility of the first semiconductive material; and thereafter (b) oxidizing a portion of the low-mobility first semiconductive material that is spaced apart from the second region to thereby create a heterostructure having three layers formed in the recited order of: (1) the second region into which the mobility enhancing species are implanted; (2) a third region which remains substantially composed of the low-mobility first semiconductive material; and (3) the oxidized portion of the low-mobility semiconductive material.

2. The fabricating method of claim 1 wherein the low-mobility semiconductive material is a monocrystal, said method further comprising:

annealing the low-mobility semiconductive material after said step of implanting the mobility enhancing species to thereby substantially repair damage caused to the crystal structure of the monocrystal due to said step of implanting the mobility enhancing species.

3. The fabricating method of claim 1 further comprising:

doping the region into which the mobility enhancing species is implanted with a dopant having a pre-specified conductivity type.

4. The fabricating method of claim 1 further comprising:

after said step of implanting the mobility enhancing species, chemically combining the mobility enhancing species with the low-mobility semiconductive material of said second region to thereby produce a compound of the mobility enhancing species and the low-mobility semiconductive material, where said compound has a comparatively higher charge carrier mobility than the low-mobility first semiconductive material.

5. A method for fabricating a Ge$_x$Si$_{1-x}$/Si/SiO$_2$ heterostructure comprising the steps of:

providing a Si substrate;

implanting Ge into the Si substrate to thereby define a Ge$_x$Si$_{1-x}$ region within the Si substrate while leaving a Si cap overlying the Ge$_x$Si$_{1-x}$ region, x being a value greater than zero but less than one; and oxidizing part of the Si cap to thereby produce said Ge$_x$Si$_{1-x}$/Si/SiO$_2$ heterostructure.

6. The fabricating method of claim 5 wherein said step of implanting Ge includes:

implanting a pre-specified concentration of Ge ions through a top surface of the substrate and into a first range of depths below the substrate top surface; and annealing the substrate to chemically combine the implanted Ge with neighboring Si.

7. The fabricating method of claim 6 wherein said step of implanting a pre-specified concentration of Ge ions includes:

implanting the Ge ions using an implant energy in the range of approximately 40 KeV to 200 KeV.

8. The fabricating method of claim 6 wherein the pre-specified concentration of said step of implanting a pre-specified concentration of Ge ions is in the range of approximately $1 \times 10^{16}$ to $10 \times 10^{16}$ Ge atoms per centimeter$^2$.

9. The fabricating method of claim 6 wherein said step of annealing includes maintaining an annealing temperature for sufficient time to chemically combine the implanted Ge with neighboring Si and substantially repair damage to the crystal structure of the Si cap due to said step of implanting the pre-specified concentration of Ge ions through the top surface of the substrate.

10. The fabricating method of claim 9 wherein said annealing temperature is approximately 1100° C.

11. The fabricating method of claim 9 wherein said sufficient time is approximately 30 minutes.

12. The fabricating method of claim 5 wherein said first range of depths is equal to or within 20 Å to 60 Å below the top surface of the substrate.

13. The fabricating method of claim 5 wherein said Si substrate is a monocrystal.

14. The fabricating method of claim 5 further comprising the step of:

forming by implantation an insulation/dielectric layer located below the $Ge_xSi_{1-x}$ region.

15. The fabricating method of claim 14 wherein the step of forming an insulation/dielectric layer by implantation includes:

a first implanting of a pre-specified concentration of oxygen and/or nitrogen ions through a top surface of the substrate and into a first range of depths below the substrate top surface; and a first annealing of the substrate to chemically combine the implanted oxygen and/or nitrogen with neighboring Si.

16. The fabricating method of claim 15 wherein said step of first implanting a pre-specified concentration of oxygen and/or nitrogen ions includes:

implanting the oxygen and/or nitrogen ions using an implant energy in the range of approximately 20 KeV to 220 KeV.

17. The fabricating method of claim 15 wherein the pre-specified concentration of said step of first implanting a pre-specified concentration of oxygen and/or nitrogen ions is in the range of approximately $2 \times 10^{17}$ to $20 \times 10^{17}$ oxygen and/or nitrogen atoms per centimeter$^2$.

18. The fabricating method of claim 15 wherein said step of first annealing includes maintaining a first annealing temperature for sufficient time to chemically combine the implanted oxygen and/or nitrogen with neighboring Si and substantially repair damage to the crystal structure of the Si cap due to said step of first implanting the pre-specified concentration of oxygen and/or nitrogen ions through the top surface of the substrate.

19. The fabricating method of claim 18 wherein said step of implanting Ge includes:

a second implanting, after said first implanting, of a pre-specified concentration of Ge ions through a top surface of the substrate and into a second range of depths below the substrate top surface; and a second annealing, after said first annealing, of the substrate to chemically combine the implanted Ge with neighboring Si.

20. The fabricating method of claim 1 wherein said step of implanting the mobility enhancing species includes:

(a.1) grading the concentration of the mobility enhancing species as a function of implant depth.

21. The fabricating method of claim 1 wherein said heterostructure defines a portion of a field effect transistor serving as a channel region of the transistor and gate insulation of the transistor.

22. A method for fabricating an integrated circuit including a $Ge_xSi_{1-x}/Si/SiO_2$ heterostructure, said method comprising the steps of:

providing a Si substrate having a top surface;

implanting oxygen and/or nitrogen ions through the top surface of the substrate to form an isolation layer below and spaced away from the substrate top surface;

annealing the substrate a first time to chemically combine the implanted oxygen and/or nitrogen with neighboring Si to thereby further form the isolation layer below the top surface of the substrate, wherein the formed isolation layer divides the Si substrate into a lower bulk portion and into an upper active portion, said active portion being disposed between the top surface of the substrate and the formed isolation layer;

implanting Ge into a region of the active portion where the Ge-implanted region is spaced away from the top surface of the substrates annealing the substrate a second time to chemically combine the implanted Ge with neighboring Si to form $Ge_xSi_{1-x}$ in the Ge-implanted region;

selectively etching away areas of the active portion of the Si substrate essentially down to the isolation layer to thereby form one or more essentially isolated mesas, at least one of the formed mesas being for containing said Ge-implanted region; and oxidizing the Si surface area.

23. A method for fabricating an integrated circuit, said method comprising the steps of:

(a) providing a monocrystalline Si substrate having a top surface;

(b) implanting oxygen and/or nitrogen through the top surface of the substrate to form an isolation layer below and spaced away from the substrate top surface, said isolation layer dividing the Si substrate into a bulk lower portion and into an upper portion;

(c) implanting Ge into one or more regions of the upper portion so as to form one or more the Ge-implanted regions that are spaced away from the top surface of the substrate, the spacing between the one or more Ge-implanted regions and the top surface defining capping Si;

(d) annealing the substrate so as to further combine the implanted Ge with the Si in the one or more Ge-implanted regions; and (e) oxidizing a portion but not all of the capping Si.

24. A method for fabricating an integrated circuit according to claim 23 wherein:

(c.1) said step (c) of implanting Ge further causes said one or more Ge-implanted regions to be spaced away from the isolation layer, the spacing between the one or more Ge-implanted regions and the isolation layer being occupied by monocrystalline Si.

25. A method for fabricating an integrated circuit according to claim 24 wherein:

(c.2) said step (c) of implanting Ge further causes said one or more Ge-implanted regions to have other than Gaussian variations in concentrations of Ge relative to concentrations of Si therein, the variations being a function of depth below said top surface.

26. A method for fabricating an integrated circuit according to claim 25 wherein:

(c.3) said step (c) of implanting Ge further causes said one or more Ge-implanted regions to have monotonicly decreasing concentrations of Ge relative to concentrations of Si therein as a function of increasing depth below said top surface.

27. A method for fabricating an integrated circuit according to claim 26 where in:

(c.3) said step (c) of implanting Ge further causes said one or more Ge-implanted regions to have concentrations of Ge relative to concentrations of Si equal to or less than of 25% atomic.

28. A method for fabricating an integrated circuit according to claim 24 further comprising the step of:

(f) implanting one or more dopants into said capping Si for defining one or more respectively doped regions of respective conductivities within the capping Si.

29. A method for fabricating an integrated circuit according to claim 28 further comprising the step of:

(g) using the combination of an oxidized portion of the capping Si, a nonoxidized doped region of the capping Si, and a corresponding Ge-implanted region to define a field effect transistor.

30. A method for fabricating an integrated circuit according to claim 23 wherein:

(c.1) said step (c) of implanting Ge includes implanting using at least two different Ge dosages and two different implant energies.

31. A method for fabricating an integrated circuit according to claim 23 further comprising the step of:

(f) selectively etching away parts of the active portion of the Si substrate to thereby form one or more substantially isolated mesas, one or more of the formed mesas being situated for containing a respective one or more of the Ge-implanted regions.

32. A method for fabricating an integrated circuit according to claim 31 further comprising the step of:

(g) using the combination of respective mesas and corresponding Ge-implanted regions to define a plurality of field effect transistors each having a channel portion, where each said channel portion is essentially isolated from said bulk lower portion of the substrate by the isolation layer, and where each said channel portion is further essentially isolated from neighboring transistors by isolation provided by the respective mesa.

33. A method for fabricating an integrated circuit according to claim 23 wherein:

(c.1) said step (c) of implanting Ge causes said one or more Ge-implanted regions to be each completely surrounded by monocrystalline Si.

34. A method for fabricating an integrated circuit, said method comprising the steps of:

(a) providing a monocrystalline Si substrate having a top surface and a buried isolation layer formed below and spaced away from the substrate top surface, said isolation layer dividing the Si substrate into a lower portion and into an upper portion;

(b) implanting Ge into one or more regions of the upper portion so as to form one or more the Ge-implanted regions that are spaced away from the top surface of the substrate, the spacing between the one or more Ge-implanted regions and the top surface defining capping Si; and (c) oxidizing a portion but not all of the capping Si.

* * * * *

UNITED STATES PATENT AND TRADEMARK OFFICE
CERTIFICATE OF CORRECTION

PATENT NO. : 5,792,679
DATED : August 11, 1998
INVENTOR(S) : Tatsuo Nakato

It is certified that error appears in the above-indentified patent and that said Letters Patent is hereby corrected as shown below:

Column 5, line 18, "lid" should be --11d--.
Column 10, line 29, "substrates" should be --substrate;--.

Signed and Sealed this

Twenty-seventh Day of October, 1998

*Attest:*

BRUCE LEHMAN

*Attesting Officer*     *Commissioner of Patents and Trademarks*